(12) United States Patent
Nair

(10) Patent No.: US 6,646,245 B2
(45) Date of Patent: *Nov. 11, 2003

(54) FOCAL PLANE AVERAGING IMPLEMENTATION FOR CMOS IMAGING ARRAYS USING A SPLIT PHOTODIODE ARCHITECTURE

(75) Inventor: Raj Nair, Hillsboro, OR (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/234,857

(22) Filed: Jan. 22, 1999

(65) Prior Publication Data

US 2002/0011551 A1 Jan. 31, 2002

(51) Int. Cl.[7] .................................................. H01L 27/00
(52) U.S. Cl. ....................................................... 250/208.1
(58) Field of Search ........................... 250/208.1–208.6, 250/226; 348/315; 345/90–93

(56) References Cited

U.S. PATENT DOCUMENTS

| | | | | |
|---|---|---|---|---|
| 4,991,127 A | * | 2/1991 | Crookshanks | 382/274 |
| 5,150,394 A | * | 9/1992 | Karellas | 378/62 |
| 5,552,827 A | * | 9/1996 | Maenaka et al. | 348/266 |
| 5,812,191 A | * | 9/1998 | Orava et al. | 348/308 |
| 5,890,095 A | * | 3/1999 | Barbour et al. | 702/40 |
| 5,949,483 A | * | 9/1999 | Fossum et al. | 348/303 |
| 5,973,311 A | * | 10/1999 | Sauer et al. | 250/208.1 |
| 6,008,486 A | * | 12/1999 | Stam et al. | 250/208.1 |
| 6,011,531 A | * | 1/2000 | Mei et al. | 345/92 |
| 6,388,706 B1 | * | 5/2002 | Takizawa et al. | 348/273 |

* cited by examiner

Primary Examiner—Thanh X. Luu
(74) Attorney, Agent, or Firm—Blakely, Sokoloff, Taylor & Zafman LLP

(57) ABSTRACT

A photosensor structure including pixel areas. Each pixel area represents an electrical pixel. The photosensor structure also has a predetermined number of quadrants. Each is positioned in a corner of one of the pixel areas. Each quadrant belongs to different optical pixels.

7 Claims, 3 Drawing Sheets

TABLE 300

```
272 203    204 232    197 204
175 198    255 193    237 231
      [176]      [208]
235 198    246 168    220 199
168 195    202 191    197 221
      [171]      [148]
155 145    176 223    205 172
206 151    193 199    177 200
```

TABLE 301

TYPICAL CMOS PHOTOSENSOR (PRIOR ART)

| | INT TIME (ms) | TEMPERATURE | | | |
|---|---|---|---|---|---|
| | | 0.00 | 10.00 | 30.00 | 40.00 |
| GAIN 1 | 1.00 | 54.54 | 56.43 | 50.18 | 39.93 |
| | 5.00 | 47.30 | 52.74 | 43.92 | 39.90 |
| | 10.00 | 52.51 | 44.76 | 38.17 | 34.42 |
| | 20.00 | 44.43 | 41.11 | 33.38 | 29.78 |
| GAIN 4 | 1.00 | | | 42.34 | 40.29 |
| | 5.00 | 44.58 | 40.42 | 30.24 | 25.12 |
| | 10.00 | 39.90 | 34.50 | 23.19 | 15.96 |
| | 20.00 | 33.83 | 28.15 | 13.51 | -3.61 |

FRAGMENTED PIXEL (INVENTION)

| | INT TIME (ms) | TEMPERATURE | | | |
|---|---|---|---|---|---|
| | | 0.00 | 10.00 | 30.00 | 40.00 |
| GAIN 1 | 1.00 | 61.88 | 61.79 | 55.35 | 44.54 |
| | 5.00 | 51.66 | 56.57 | 48.11 | 44.52 |
| | 10.00 | 55.70 | 48.56 | 42.95 | 39.33 |
| | 20.00 | 47.74 | 45.81 | 38.05 | 34.89 |
| GAIN 4 | 1.00 | | | 47.45 | 45.09 |
| | 5.00 | 48.16 | 45.05 | 34.76 | 29.88 |
| | 10.00 | 44.05 | 38.14 | 27.69 | 20.78 |
| | 20.00 | 37.28 | 31.86 | 18.22 | 2.31 |

SNR ADVANTAGE

| | | | |
|---|---|---|---|
| 7.34 | 5.36 | 5.16 | 4.61 |
| 4.36 | 3.84 | 4.19 | 4.62 |
| 3.20 | 3.80 | 4.78 | 4.91 |
| 3.31 | 4.70 | 4.67 | 5.11 |
| | | 5.11 | 4.81 |
| 3.58 | 4.63 | 4.53 | 4.76 |
| 4.15 | 3.63 | 4.50 | 4.82 |
| 3.44 | 3.70 | 4.70 | 5.91 |

Fig. 3

FOCAL PLANE AVERAGING IMPLEMENTATION FOR CMOS IMAGING ARRAYS USING A SPLIT PHOTODIODE ARCHITECTURE

BACKGROUND OF THE INVENTION (1) Field of the Invention

The present invention is related to complementary metal oxide semiconductor (CMOS) photodiodes and photogates, more specifically, the method and apparatus of the present invention is related to a focal plane averaging implementation for CMOS imaging arrays.

(2) Background

The capture of image data using CMOS imaging devices is typically achieved with arrays of picture sensing elements or pixels, where each pixel consists of a photodiode or a photogate, a charge storage capacitance, exposure time control elements and read out devices. A photodiode (or a photogate) is a semiconductor device that produces significant photocurrent when illuminated. A photocurrent is an electric current produced in a device by the effect of incident electromagnetic radiation in the visual frequencies. An image focused on an array of pixels excites the photosensors within pixels of the array differently resulting in different charge and corresponding signal values directly related to the quantum of energy incident upon the pixels.

The registration of images through a semiconductor imaging array is associated with numerous noise components, such as reset noise, read noise, shot noise and fixed pattern noise, many of which are eliminated by known architectural and circuit techniques, such as correlated double sampling and delta double sampling. Noise may also be eliminated by using system level solutions such as dark frame subtraction.

Noise includes undesired electrical signals that occur within electronic or electrical devices, circuits, or apparatus and that result in changes in the values obtained. Noise components in electronic image capture which are not eliminated despite the implementation of the techniques mentioned, include flicker or 1/f noise in an output chain, thermal (kT/C) noise, A/D (analog-to-digital) quantization noise and photon/dark shot noise.

Flicker noise, also known as low frequency or excess noise, is a noise component with a spectral density which increases as frequency decreases, and is in excess of the thermal and the shot noise components within semiconductor components. Flicker noise has a Gaussian Probability Density Function (PDF) and its spectral density is known to be proportional to the electrical current passing through the device in consideration and inversely proportional to the frequency.

Thermal noise, also known as Johnson or Nyquist noise, induces a fluctuating potential difference across the ends of any conductor that is caused by the random, thermally induced motion of electrons within the conductor. The spectral density of this noise component, which also has a Gaussian PDF as anticipated for a phenomenon that results from a large number of random events, is proportional to the electrical resistance and the bandwidth of the conductor.

Shot noise in semiconductor devices results from the passage of charged carriers across a semiconductor junction associated with a potential barrier. Shot noise, by definition, is noise caused by the random passage of carriers across a potential barrier and the spectral density of the shot noise is directly proportional to the average electrical current flowing through the potential barrier. Shot noise exhibits itself as a fluctuating emf whose mean square value is proportional to the average current flow.

All noise sources in a CMOS imaging array results in a significant pixel to pixel variation in the value registered when the imaging array is exposed to a uniform field of elimination. At very low light levels dark shot noise is seen to be the dominant noise component that results in a grainy resultant image, particularly in imaging arrays where dark current is a significant value within the pixels. Dark shot noise is the random component associated with dark current, which is the leakage current from the pixel storage node in the dark.

Other noise components not eliminated by traditional architectural techniques act incrementally to reduce the signal to noise ratio (SNR) in low light imaging using CMOS sensors. Examples of effects that degrade SNR and are not removed despite minimization architectures include reset noise and photo response non-uniformity on a photo-sensor layer. More specifically, reset noise is a random variation in the "RESET" value within a pixel that is not removed due to the implementation of a time uncorrelated reset operation between the full array reset and the readout reset phases. Photo response non-uniformity is the non-uniformity in the response of the pixels of the imaging array to a uniform field of illumination and is a consequence of processing/manufacturing imperfections.

A typical photodiode-based pixel layout on a standard CMOS process has the advantage that space within the pixel is optimally utilized. However, the structure has disadvantages in that each pixel's photodiode is placed right next to circuitry within adjacent pixels and hence is susceptible to cross-talk, which could be signal dependent, as well as of a fixed nature. The photodiodes are also separated from each other by the pixel pitch and are therefore susceptible in terms of adjacent pixel variability in dark/photo response. The photodiodes are also susceptible to semi-conductor processing related variations, which could have spatial frequencies comparable to the pixel pitch.

It is desirable to have a method and apparatus on CMOS photodiode/photogate based imaging integrated circuits with multiple metal layers for achieving focal plane averaging, which has associated advantages in the signal to noise ratio (SNR).

BRIEF SUMMARY OF THE INVENTION

A photosensor structure including pixel areas. Each pixel area represents an electrical pixel. The photosensor structure also has a predetermined number of quadrants. Each is positioned in a corner of one of the pixel areas. Each quadrant belongs to different optical pixels.

BRIEF DESCRIPTION OF THE DRAWINGS

FIG. 3 illustrates an exemplary SNR improvement estimate.

DETAILED DESCRIPTION OF THE INVENTION

The present invention is a novel method for use with semiconductor photodiode/photogate based imaging integrated circuits with multiple metal layers for achieving focal plane averaging, which has associated advantages in signal to noise ratio (SNR). The present invention realizes fragmentation of pixel structure and interconnection of fragmented pieces in a fashion which achieves focal plane averaging.

Figure 1A:
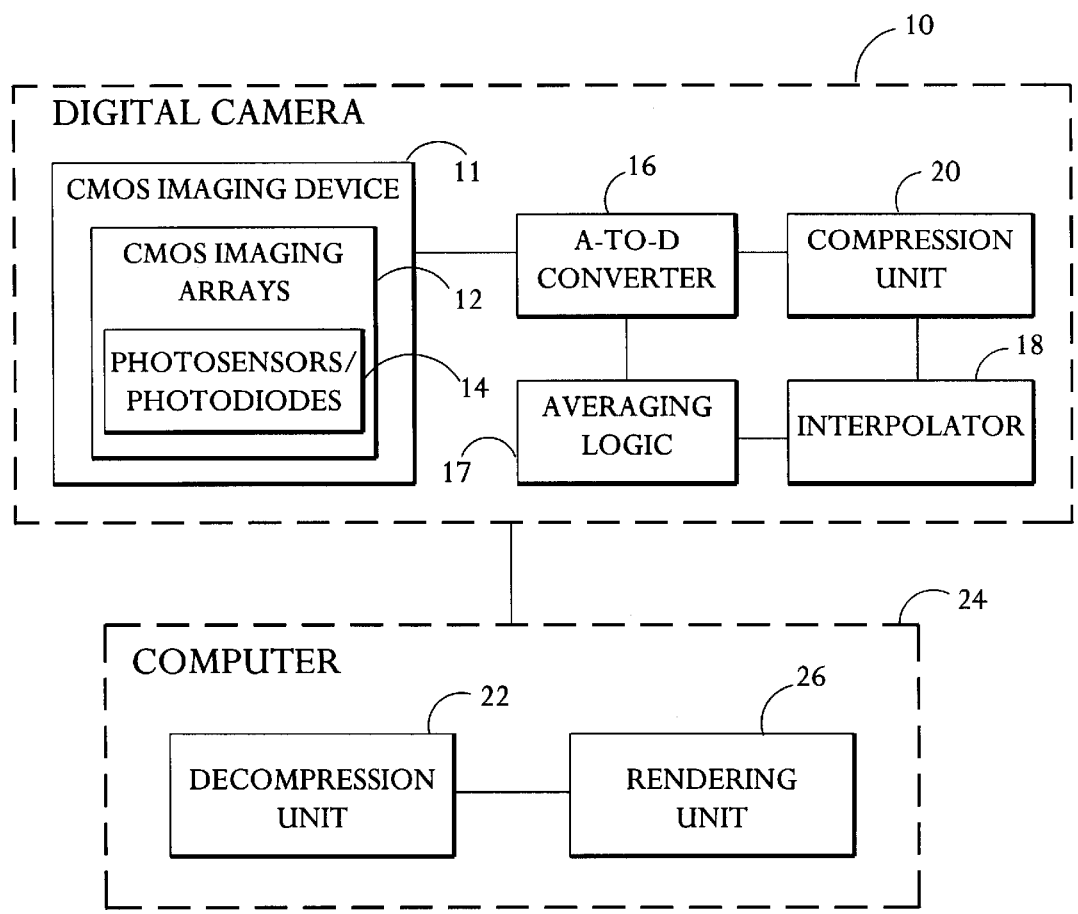
FIG. 1a is an exemplary block diagram with a CMOS imaging device implemented with the present invention's split photo-diode architecture.

FIG. 1a is an exemplary system block diagram with a CMOS imaging device implemented with the present invention's split photo diode architecture. An exemplary CMOS imaging device 11 residing in a digital image capture device such as a digital camera 10 is implemented with CMOS imaging arrays 12.

The CMOS imaging arrays 12 is implemented in the present invention's split photo diode architecture and is configured to read images in response to a collection of light reflected off photosensors (photodiodes) 14 located on the CMOS imaging arrays 12. The image read off the CMOS imaging arrays 12 cause electrons on the photosensors (photodiodes) 14 to be converted to a series of analog charges which are then converted to digital values by an analog-to-digital converter 16. An averaging logic 17 generates pixel values by performing focal plane averaging on the photo response of predetermined optical pixels. The resulting digital values are then interpolated into full color values by an interpolater 18 and compressed by a compression unit 20.

The compressed data may then be decompressed by a decompression unit 22 on a computer 24 and the image captured may then be caused to display on a display device (not shown) through a rendering unit 26.

The CMOS imaging arrays 12 is implemented with the present invention's split photo diode architecture with multiple metal layers for achieving focal plane averaging which has associated advantages in the signal to noise ratio (SNR).

Figure 1B:
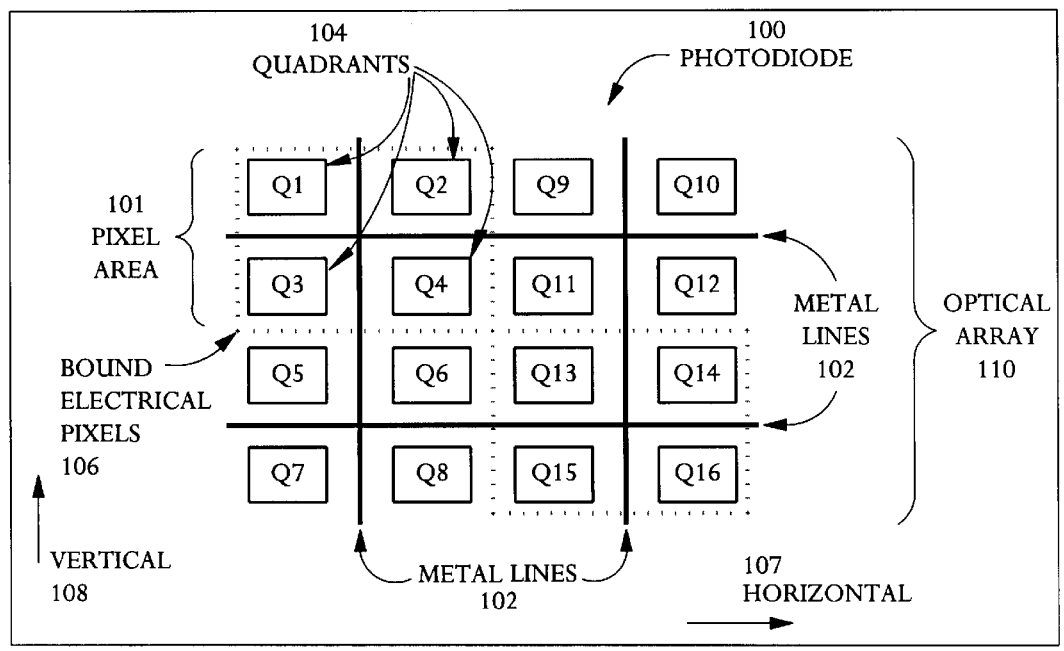
FIG. 1b illustrates an embodiment of the split-photodiode pixel structure of the present invention.

FIG. 1b illustrates an exemplary split-photodiode (photosensor) pixel structure of the present invention. The split-photodiode structure of the present invention segments a single large photodiode 100 into four pieces with each piece positioned in a corner of a corresponding pixel area 101. Such configuration allows for the placement of all the circuitry associated with the pixel in the central space between the photodiodes, and positions the quadrants 104 of the photodiodes of the adjacent pixels very close to each other.

The connectivity to the devices that are located within the pixels are achieved through metal lines 102 which lie along the central axes of the pixels, hence forming optical windows which optically separate the four quadrants 104 of an electrical pixel. The optical array 110 (array of windows formed of the spaces separated by the metal lines) is therefore shifted spatially, both along the horizontal axis 107 and the vertical axis 108 of the imaging array 12, by a distance of approximately half the pixel pitch with respect to the electrical pixels. The electrical pixels are formed by the four quadrants (e.g. quadrants 104) located in the four corners of the pixel area (e.g. pixel area 101) connected electrically to each other.

The dotted lines bound electrical pixels or structures electrically connected to one another, forming a single circuit. Namely, quadrant one (Q1), quadrant two (Q2), quadrant three (Q3), and quadrant four (Q4) are the four quadrants 104 of the photodiode 100 of one electrical pixel 106, but belong to different optical pixels, as determined by the metal lines 102 that pass between them. More specifically, in the illustrated embodiment, the "optical" pixels are shifted spatially with regard to the "electrical" pixels. Quadrants $Q_1$, $Q_2$, $Q_3$, and $Q_4$ form the "electrical" pixel, whereas Quadrants $Q_4$, $Q_{11}$, $Q_6$, and $Q_{13}$ form an "optical" pixel in the invention. This is in contrast to prior art designs where the "optical" and "electrical" pixels are one and the same.

Assuming that the quadrants $Q_1$, $Q_2$, $Q_3$ and $Q_4$ belong to pixel P(x,y), where "x" and "y" are the horizontal and vertical indices, the value of pixel P(x,y) is provided by $P(x,y)=[P_{(x-1/2, y-1/2)}+P_{(x-1/2, y+1/2)}+P_{(x+1/2, y+1/2)}+P_{(x+1/2, y-1/2)}]/4$. $P_{(x-1/2, y-1/2)}$ here represents the photo-response of the optical pixel that quadrant $Q_3$ of $P_{(x,y)}$ belongs to. $P_{(x-1/2, y+1/2)}$ represents the photo-response of the optical pixel that quadrant $Q_1$ belongs to. $P_{(x+1/2, y+1/2)}$ represents the photo-response of the optical pixel that $Q_2$ belongs to. $P_{(x+1/2, y-1/2)}$ represents the photo-response of the optical pixel (namely $Q_4$, $Q_{11}$, $Q_6$ and $Q_{13}$) that quadrant $Q_4$ belongs to P(x,y) is therefore the average value of the photo-response of the four "optical" pixels to which each of the quadrants $Q_1$, $Q_2$, $Q_3$ and $Q_4$ belongs to.

If there is noise, the noise introduces a variance between the values registered by the "optical" pixels despite a uniform field of incident illumination. This noise is minimized by the separation of the optical and electrical pixels in the illustrated split-photodiode pixel structure of the present invention, and by the averaging of the four optical pixel values as represented by P(x,y) as was described above.

Figure 2:
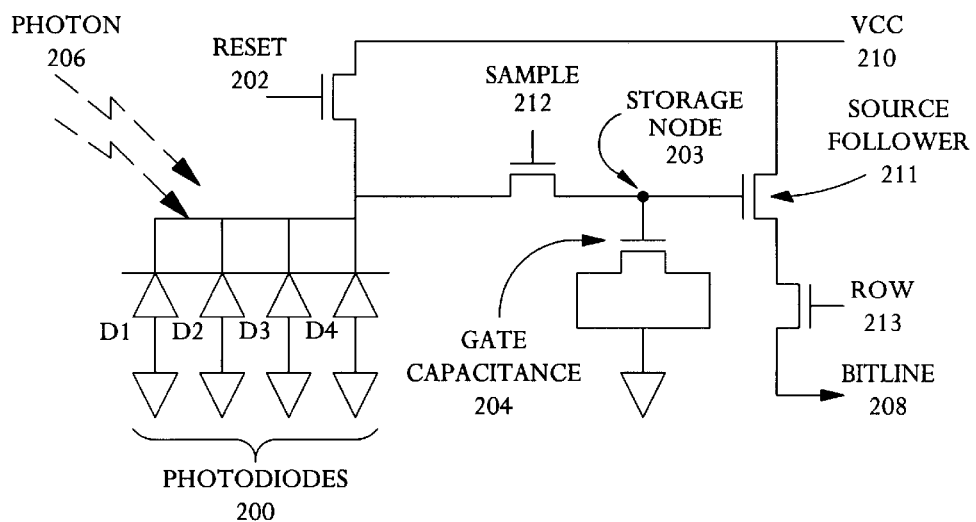
FIG. 2 illustrates an exemplary schematic of a split photodiode pixel.

FIG. 2 illustrates one embodiment of a split photodiode (photosensor) pixel design based on the present invention's split-photodiode pixel structure illustrated in FIG. 1a. In FIG. 2, an active pixel with a photodiode based architecture is illustrated with an array of photodiodes 200 representing the split photodiode of the present invention. Each photodiode in the array of photodiodes 200 corresponds to one of the four quadrants (e.g. $Q_1$-$Q_2$-$Q_3$-$Q_4$ quadrants 104) referenced in FIG. 1a in a photo-sensing device inside a pixel.

A device which connects to the VCC 210 is referred to as a source follower 211. The source follower 211 is an amplifier configuration and allows the development of a voltage on the bit line 208 corresponding to the voltage on the storage node 203. The storage node 203 is the gate of a device capacitance 204. "Sample" (signal) 212 is an electronic shutter control that bridges the photodiodes 200 and the storage node 203. "Row" (signal) 213 enables the read-out of the signal through the bit line 208.

In the exemplary embodiment, a certain amount of charge is stored inside a pixel which is transmitted into the pixel through a reset transistor 202. The charge stored is stored both on a photodiode capacitor and a gate capacitance 204. Photons 206 representing illumination striking the photodiodes 200, discharge each node together and therefore reduce the voltage on the storage node 203, which connects to the gate of the source follower device 211 which in turn connects to the bit line 208. Further, the photodiode quadrants connect electrically to each other to discharge the same storage node during photo exposure.

Although FIG. 2 is illustrated with four photodiodes 200, given the detailed description herein, a person skilled in the art may appreciate that any number of photodiodes may be added, and that the selected number of photodiodes are for illustration purposes only.

FIG. 3 illustrates exemplary SNR improvement estimates gained by the design of the present invention. For illustration, it is assumed here that all pixels are illuminated uniformly by light, the true signal level obtained is s volts and the noise content is n volts due to various sources. $n_r$ volts is the total noise content contributed by an effect dependent upon the spatial position of the pixels. In a typical pixel structure, this would result in a reduction in the total SNR.

Assuming that $n_r$ is the contribution of two adjacent rows, and that the rows on either side of the affected rows are connected to pixels and row circuitry of nominal behavior, and do not contribute to a row to row differential, the split photodiode pixel structure of the present invention reduces $n_r$ to half its value, due to averaging.

Thus, if $n_r$ were to be equal to n, and the original SNR were, for example 40 dB, the gain is approximately 2.5 dB. Further, with photoresponse variability, which has a granularity of the size of a typical pixel based on local variations of the photosensor, the split photodiode averaging effect of the present invention may reduce the photo-response variation to one-fourth the original value.

The first table 300 illustrates numbers derived from exposure of an imaging chip to a uniform field of light. The numbers as illustrated are different from each other, and this is referred to as a response non-uniformity. Some of the numbers have been removed, they are not needed for calculation in the modeling.

In the illustration, predetermined numbers are selected, for example three to four numbers, which are bracketed. The table illustrates how the numbers would be generated given the present invention's split photodiode pixel structure design. The result is the generation of numbers which are an average of their neighboring numbers. For example, given the 176 in the first table, with the present invention's photosensor design, the result would not be 176, but the average of 198, 198, 246 and 255, which are the numbers surrounding 176. The four quadrants which are closer to the four corners of the pixel senses a signal corresponding to the actual signal present in the four corners.

Thus, the bracketed numbers are raw numbers. The raw numbers are then replaced with the four quadrant averages, which is the average of the numbers surrounding the raw numbers. The process is repeated over the complete field of numbers. The result of the conversion is illustrated in the second table 301, which illustrates the signal to noise ratio (SNR) differences.

More specifically, table 301 is an embodiment of an aggregation of the results of the analysis conducted on a typical CMOS photosensor illustrating the benefits of the present invention's split photodiode pixel (fragmented photosensor) design. The analysis is conducted on a square array of pixel values at various operational settings for a given pixel (or photosensor), such as exposure ("int time"), temperature and signal amplification ("gain"). For the various operational settings, the SNR is calculated as the ratio of the mean value of the pixels in the square array to the variance, expressed in decibels.

Each number in table 301 under heading "Fragmented Pixel" (split photodiode pixel) corresponds to the SNR computed for a set of operating conditions such as gain, temperature and exposure. The numbers under the heading "SNR Advantage" are the corresponding differences in SNR, indicating improvement seen in SNR for a simulation model of the present invention's split photodiode pixel design.

What has been described is a method and apparatus for focal plane averaging implementation for CMOS imaging arrays using a split photodiode/sensor architecture. The advantages of the present invention are many, including noise reduction through simple averaging implementable at the focal plane, and reducing the computational overhead associated with software-based implementation.

Additionally, in a modified embodiment, the present invention's architecture may be utilized in the reduction of pixel to pixel non-uniformity in photosensitivity, which relates to the minimization of process-based variations, as well as minimization of architecture and timing-based differentials, which are not removed by traditional designs. Further, electrical cross-talk due to coupling effects from adjacent pixels may be reduced, since the readout circuitry is located at the center of the pixel. This improves the signal to noise ratio (SNR) of a photosensor.

While certain exemplary embodiments have been described in detail and shown in the accompanying drawings, it is to be understood that such embodiments are merely illustrative of and not restrictive on the broad invention, and that this invention is not to be limited to the specific arrangements and constructions shown and described, since various other modifications may occur to those with ordinary skill in the art.

What is claimed:

1. A system comprising:

an imaging device comprising:
    a plurality of photo-sensing devices arranged into Quadrants to form an array; and
    a circuit to generate a plurality of pixel signals each being a focal plane average of signals generated by said Quadrants of photo-sensing devices, wherein said circuit comprises:
        a first switching device to simultaneously transmit changes to said quadrants of photo-sensing devices to form said pixel signal;
        a storage node to store said pixel signal;
        a second switching device to selectively couple said quadrant of photo-sensing devices to said storage node;
        a third switching device to selectively couple said storage node to a bitline; and
        a interpolator to generate a color value from each of said pixel signal.

2. The system of claim 1, further comprising a plurality of metal lines configured to line along a central axis of each of said Quadrants of photo-sensing devices.

3. The system of claim 1, wherein said circuit comprises capacitance elements to respectively store said pixel signals.

4. The system of claim 3, wherein said capacitance elements each comprise a gate capacitance of a field effect transistor.

5. The system of claim 3, wherein said second switching device to selectively couple a distinct combination of photo-sensing devices to a corresponding capacitance element.

6. The system of claim 1, wherein said third switching device to output said pixel signal in response to an enable signal.

7. The system of claim 1, further comprising a compression unit to compress data associated with each color value generated by said interpolator.

* * * * *